United States Patent
Pylant et al.

(10) Patent No.: US 6,915,906 B2
(45) Date of Patent: Jul. 12, 2005

(54) WAFER STORAGE CONTAINER WITH WAFER POSITIONING POSTS

(75) Inventors: James D. Pylant, Temecula, CA (US); Scott C. Bradley, Carlsbad, CA (US)

(73) Assignee: Peak Plastic & Metal Products (International) Limited, Hong Kong (HK)

( * ) Notice: Subject to any disclaimer, the term of this patent is extended or adjusted under 35 U.S.C. 154(b) by 0 days.

(21) Appl. No.: 10/623,131

(22) Filed: Jul. 14, 2003

(65) Prior Publication Data

US 2005/0011809 A1 Jan. 20, 2005

(51) Int. Cl.[7] .............................................. B65D 85/30
(52) U.S. Cl. ...................................... 206/710; 206/454
(58) Field of Search ........................ 206/303, 454–456, 206/710, 449; 211/41.18; 118/500

(56) References Cited

U.S. PATENT DOCUMENTS

| | | | | |
|---|---|---|---|---|
| 3,080,964 A | * | 3/1963 | Robinson et al. | 206/303 |
| 4,475,652 A | * | 10/1984 | Heard | 206/303 |
| 4,776,462 A | * | 10/1988 | Kosugi et al. | 206/454 |
| 5,248,035 A | * | 9/1993 | Gallagher | 206/427 |
| 5,284,241 A | * | 2/1994 | Winton et al. | 206/303 |
| 5,551,571 A | * | 9/1996 | Lin et al. | 206/710 |
| 6,119,865 A | * | 9/2000 | Kawada | 206/710 |
| 6,237,771 B1 | * | 5/2001 | Haq | 206/454 |
| 6,338,409 B1 | * | 1/2002 | Neary | 206/710 |
| 6,550,619 B2 | | 4/2003 | Bores et al. | 206/710 |
| 2003/0010657 A1 | | 1/2003 | Zabka et al. | |
| 2003/0066780 A1 | | 4/2003 | Zabka et al. | |

* cited by examiner

Primary Examiner—Luan K. Bui
(74) Attorney, Agent, or Firm—Isabelle R. McAndrews (57) ABSTRACT

An injection molded container for storing and transporting wafers includes a base having a wafer area upon which to place a stack of a plurality of wafers. A protective wall surrounds the wafer area, and extends upward, having a first perimeter at the base and a second perimeter at a top wall extremity that is greater than the first perimeter, resulting in the wall being positioned with a draft angle to a line perpendicular to a plane of the base so as to facilitate removal of the container from an injection mold. This invention provides a plurality of wafer positioning columns, each having a surface with a line of contact rising perpendicular to the plane of the base. The lines of contact are positioned so as to restrict movement of a stack of wafers placed in the container.

21 Claims, 8 Drawing Sheets

FIG. 1
(PRIOR ART)

SECTION II-II

WAFER STORAGE CONTAINER WITH WAFER POSITIONING POSTS

This application is related to pending U.S. patent application entitled "Wafer Shipper With Orientation Control," Ser. No. 10/621,031, filed on the same day as this application, and which is expressly incorporated by reference herein.

BACKGROUND OF THE INVENTION

1. Field of the Invention

The present invention is related generally to wafer storage containers, and more particularly to an injection molded storage container with protective walls formed at a draft angle, and wafer positioning posts oriented with no draft angle.

2. Description of the Prior Art

Figure 1:
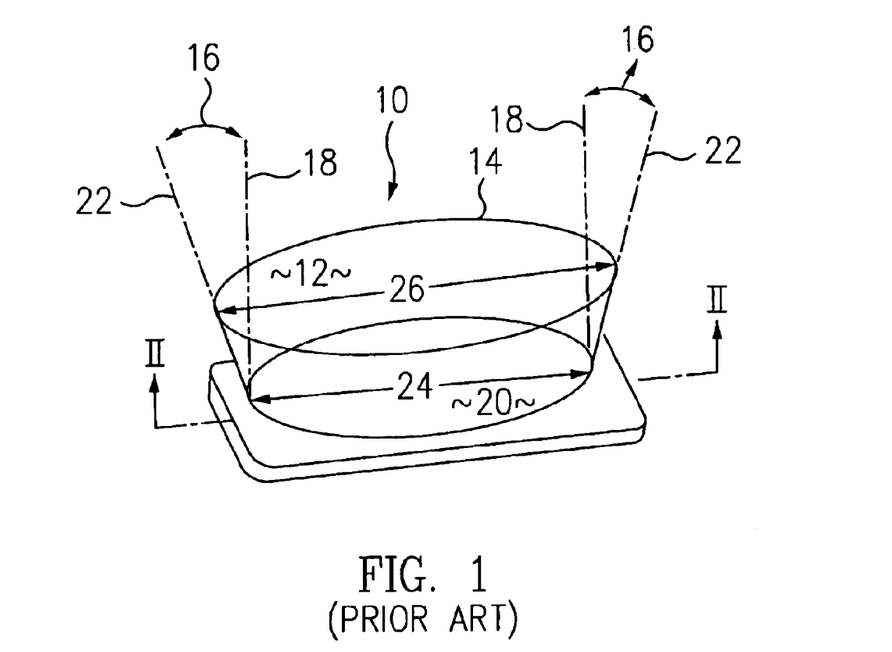
FIG. 1 illustrates the draft angle of a prior art injection container.

Storage and shipping containers for wafers are often injection molded and have walls surrounding the wafers for protection. FIG. 1 is an illustration of an injection molded container 10. Using standard injection molding practices, the inside surface 12 of the container walls 14 of the container must have what is called a draft angle, such as angle 16 between a perpendicular line 18 from the plane 20 of the container base and a line 22 tangent to the wall 14 for the inside surface 12 of the container. This construction leaves the inside diameter 24 at the base plane 20 of the container smaller than the diameter 26 at the top, which is a condition that allows the container to be removed from the mold from which it is formed. A draft angle is also needed for the outside wall surface.

Figure 2:
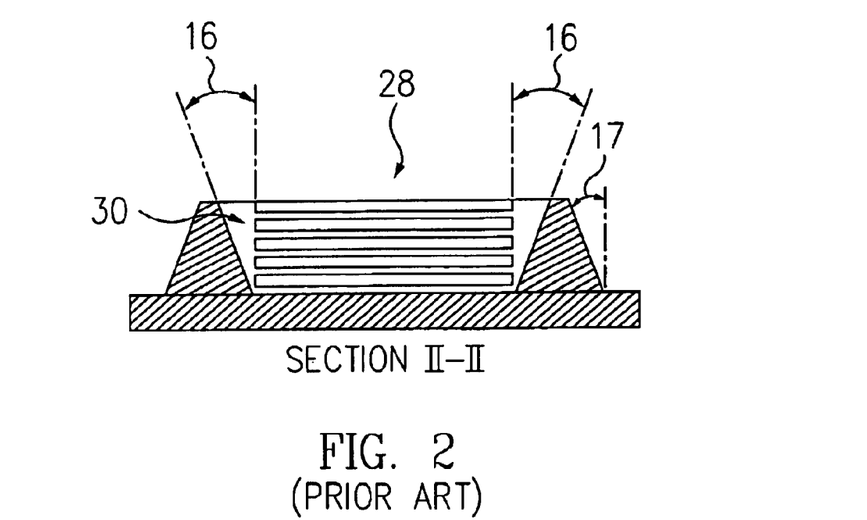
FIG. 2 illustrates the potential movement of a stack of wafers in a prior art injection molded container.

FIG. 2 is a cross-sectional view of the container of FIG. 1, for more clearly showing the draft angle 16 of the inside wall surface, as well as a draft angle 17 for the outside wall surface, and for illustrating the problem with the injection molded construction when the container 10 is used to transport a stack 28 of wafers. The draft angle 16 is clearly exaggerated in FIGS. 1 and 2 for ease of illustration. The problem with the draft angle, is that it causes a gradual increase in the space 30 between the wafers and the wall as the stack is increased in height, and thereby allowing wafer movement. The wafers can be chipped or scratched as a result of movement in the container, and generally the risk of damage to a disk in a container is proportional to the degree of movement in the container.

SUMMARY

It is an advantage of this invention in that it provides an improved wafer storage container.

It is a further advantage of this invention in that it provides a storage container for wafers that minimizes wafer movement in the container.

In one embodiment of the present invention, an injection molded container for storing and transporting wafers includes a base having a wafer area upon which to place a stack of a plurality of wafer elements. The term "wafer element" will be used as a generic term to describe a wafer or a wafer mounted on a wafer frame. A protective wall surrounds the wafer area, and extends upward, having a first perimeter at the base and a second perimeter at a top wall extremity that is greater than the first perimeter, resulting in the wall being positioned with a draft angle to a line perpendicular to a plane of the base so as to facilitate removal of the container from an injection mold. This invention provides a plurality of wafer element positioning columns, each having a surface with a line of contact rising perpendicular to the plane of the base. The lines of contact are positioned so as to restrict movement of a stack of wafer elements placed in the container.

DESCRIPTION OF THE PREFERRED EMBODIMENTS

While the present invention will be described herein with reference to particular embodiments thereof, a latitude of modifications, various changes and substitutions are intended, and it will be appreciated that in some instances some features of the invention will be employed without a corresponding use of other features without departing from the spirit and scope of the invention as described with respect to the preferred embodiments set forth herein.

Figures 3, 4:
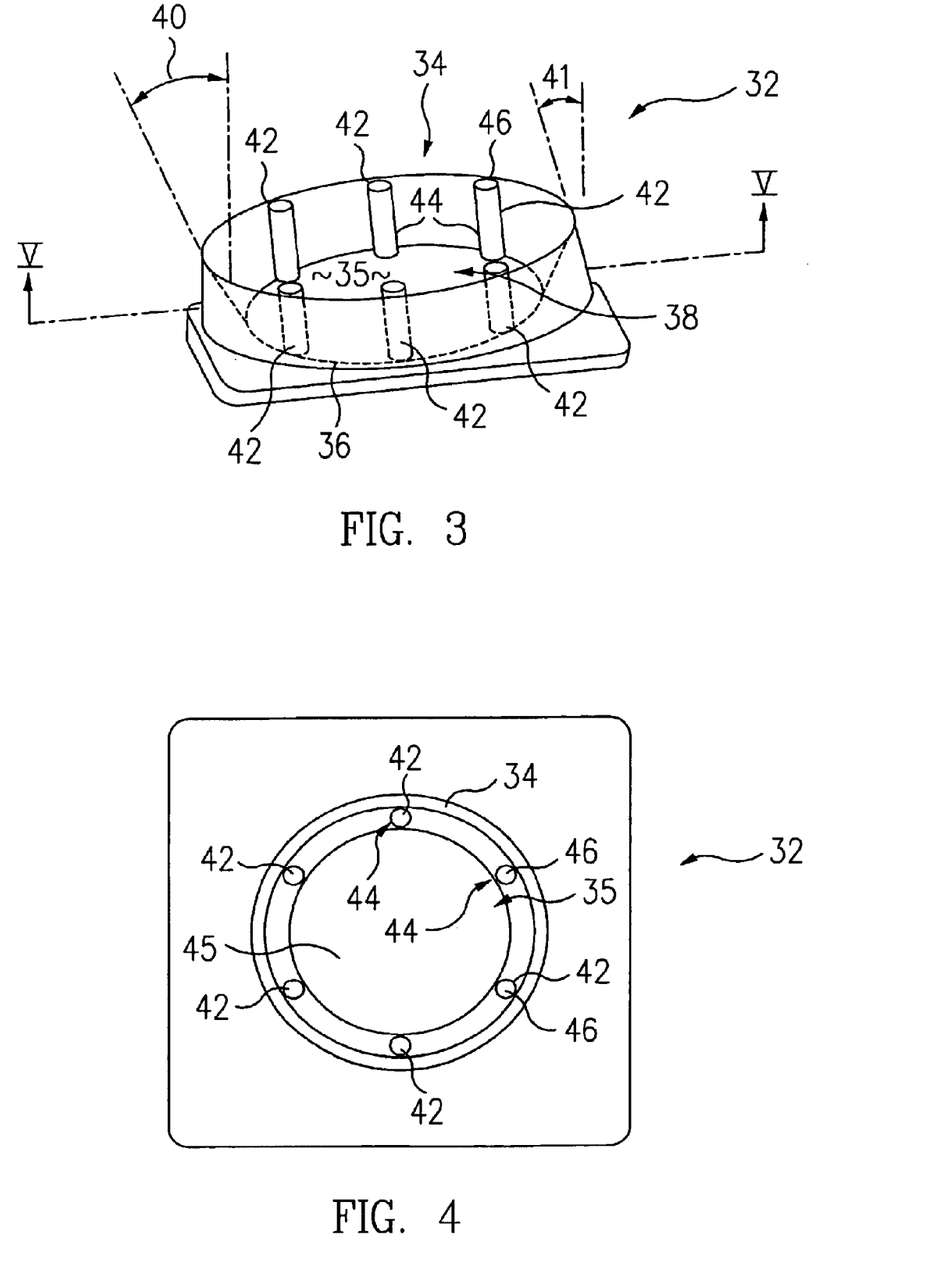
FIG. 3 is a simplified drawing for illustrating the present invention.
FIG. 4 is a top view of FIG. 3.

The concept of the present invention is illustrated in FIGS. 3 and 4 which are simplified drawings for use in describing the invention. A container 32 has a protective wall apparatus 34 extending upward from a base 35. The wall apparatus can be of any configuration compatible with injection molding for providing protection to wafers placed on a wafer plane area 36. The wall can be continuous, surrounding an enclosure 38 containing the wafer area 36 as shown, or it can be a plurality of sections. Conforming to injection molding practice, the wall or wall sections are formed with interior and exterior wall surface draft angles 40 and 41 in order to allow the container 32 to be released/ejected from the mold. The completed container 32 according to the present invention has a plurality of columns 42 positioned inside the enclosure 38 surrounded by the wall apparatus 34. The columns 42 are configured to restrict the movement of a stack of wafer elements. The term "wafer element" will be used as a generic term to describe either a wafer or a wafer mounted on a wafer frame. In an embodiment wherein the columns are formed as an integral part of the container molding process, they are configured so as to avoid excessive resistance in the process of separating the container and mold. The areas of vertical surfaces are configured so as to be insubstantial in comparison to the surfaces having a draft angle so as to not add undue resistance to separation of the mold from the container. Each column 42 is designed with a surface 44 having a line of contact for limiting wafer movement that extends vertically upward from the plane of the wafer area 36. The columns are configured and placed so that a vertical line of contact on each surface 44 is positioned so as to restrict movement of a stack of wafer elements 45 as shown in FIG. 4. As noted above, the wafer elements as defined herein can be simply a wafer, or can be a wafer attached to a wafer frame. The columns 42 are shown as round, separate posts in FIGS. 3 and 4 for ease of illustration of the principle of the present invention, but can actually be structures of any configuration that provides the required vertical line of contact, and that facilitates ejection from a mold. The column structures can, for example, be integrally formed with the wall structure. Column cross sections, for example, can be oval, square, hexagonal, triangular, etc. The columns can each have a top surface 46 to which pressure can be applied for ejecting the container from the mold. Since there is no draft angle on the posts/columns line of contact, the distance from a wafer element to the post is the same at the bottom of a stack as it is at the top of the stack.

Figure 5:
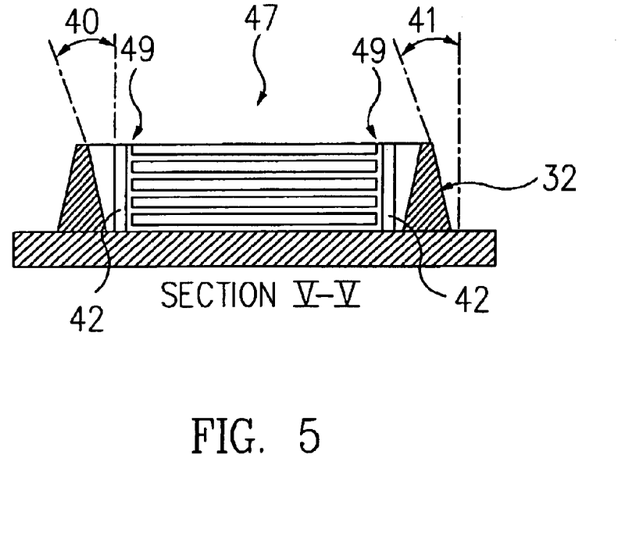
FIG. 5 is a cross sectional view of FIG. 3

FIG. 5 is a cross sectional view of FIG. 3 that shows a wafer stack 47 in place in the container 32. The view of FIG. 5 shows the uniform/equal clearance 49 provided between the posts 42 and wafer 47.

Figure 6:
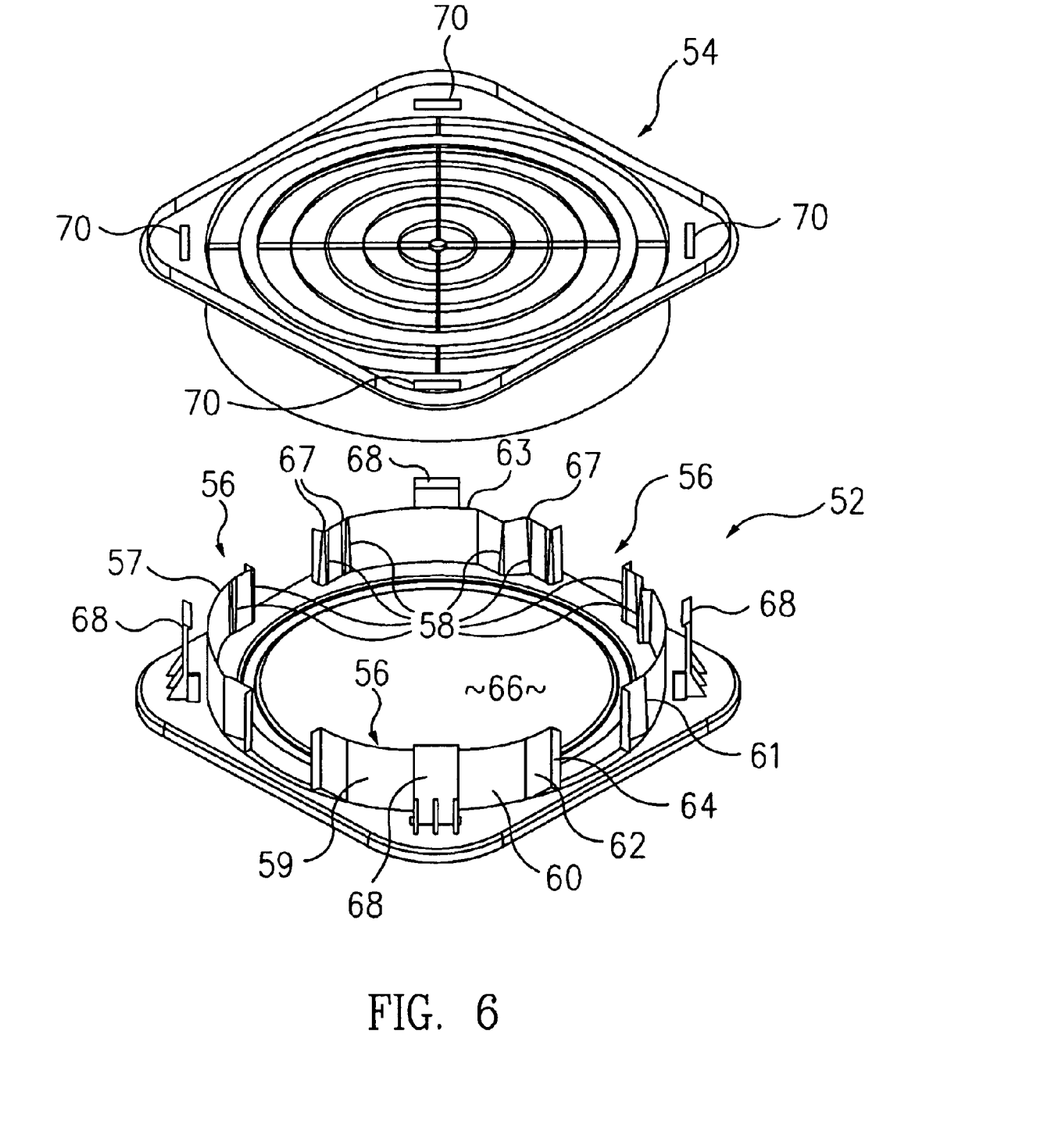
FIG. 6 is a pictorial view of a wafer storage container and cover.

FIG. 6 shows a particular embodiment of the present invention including a container 52 and a container cover 54. The wafer elements in this embodiment each include a wafer frame and wafer. In this case the wafer can be either whole or diced, as will be further explained in the following. The present invention also includes containers designed according to the principles to be described, for use with wafers, without being mounted to a frame. In this case, as will be described, the wafers will have at least one orientation artifact. The wall apparatus 56 of container 52 has four sections 57, 59, 61, 63. The irregular contours of the walls in this embodiment are designed to conform to the shape of wafer frames upon which wafers are attached. The irregular contour assures that all of the wafer frames are oriented the same in the container 52, therefore making it possible for all of the wafers to also be in the same orientation. This is an alternate/optional feature. The design uses 16 columns 58, and as shown are structures that are integrally molded with the wall structures 56. Each of the wall sections as shown has areas 60, 62 and 64, which are all molded with a draft angle, not shown, but as described in reference to FIGS. 3 and 5. The columns 58 all have a surface designed to provide a line of contact for restraining movement of the wafer elements. The lines of contact have a vertical orientation extending upward at a right angle relative to a base 66 defining a wafer plane upon which the stack of wafer elements are to be placed. Because the columns 58 in FIG. 6 are molded with the wall sections, and due to the vertical/orthogonal direction of the lines of contact i.e. no draft angle on the line of contact, the columns 58 appear wider near the top of the wall structures in FIG. 6 than at the bottom of the wall at the base 66 level. The top surfaces 67 of each column provide a substantial point of contact for application of ejector pins for pressuring the container for removal from a mold. The prongs 68 are for insertion in corresponding slots 70 in the cover 54 for securing the cover 54 over the container 52.

Figure 7A:
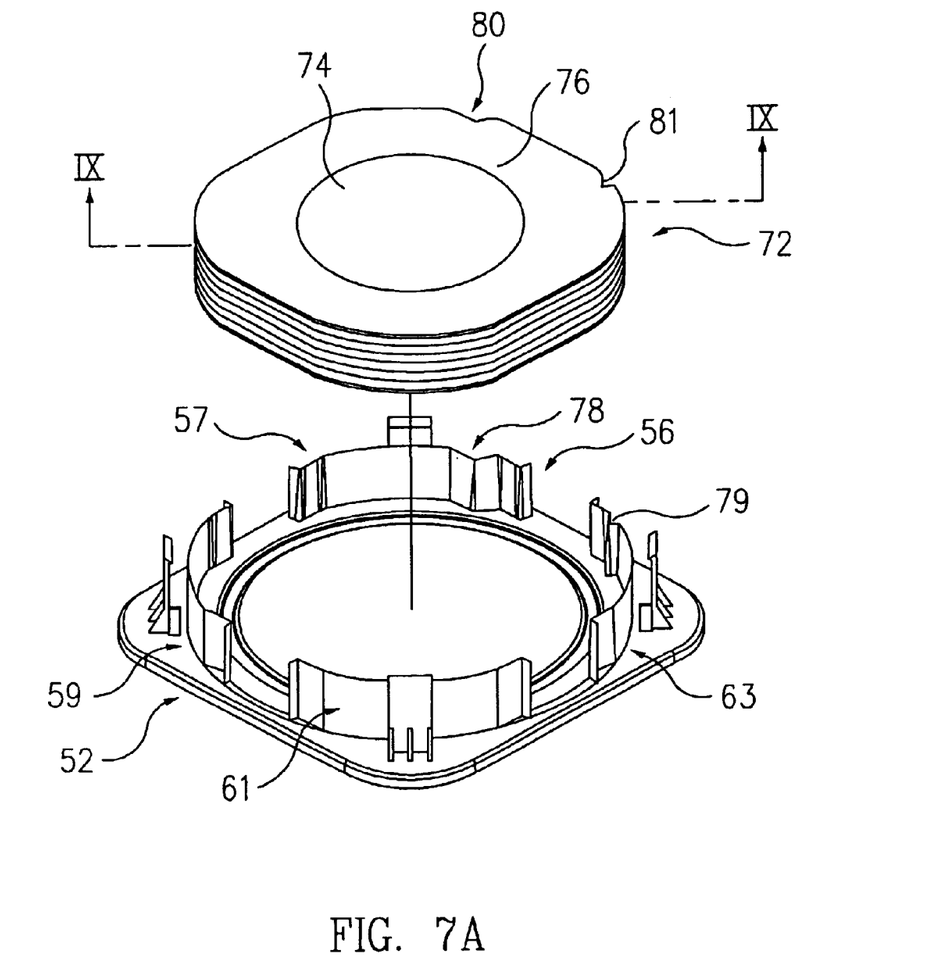
FIG. 7A illustrates a stack of wafers for placement in a container.
Figure 7B:
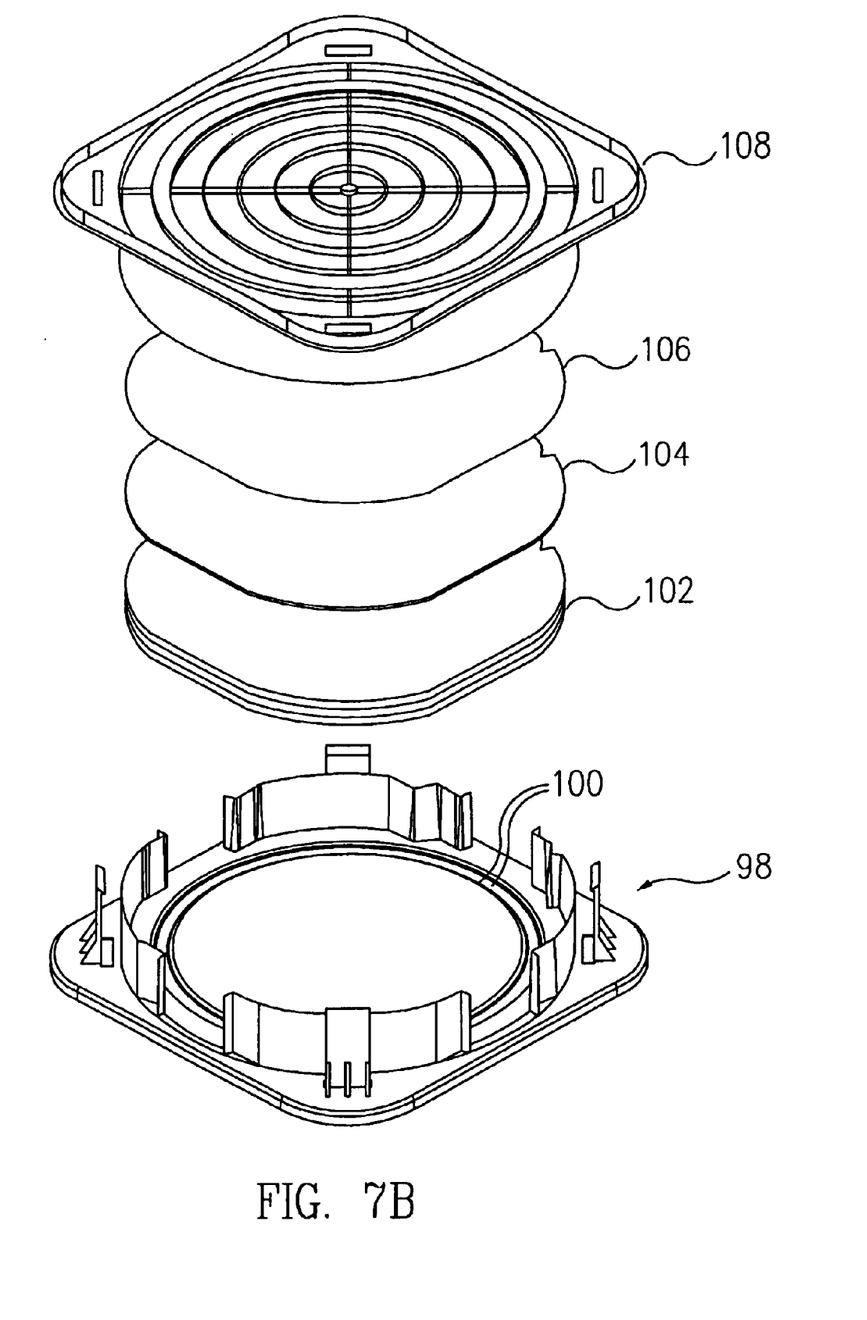
FIG. 7B illustrates separators between wafer elements.

FIG. 7A illustrates a stack 72 of wafer elements, wherein each wafer, such as wafer 74 is mounted on a wafer frame 76 having an irregular outline which matches a corresponding outline of the wall structure 56 in order to assure consistent alignment of the wafers in the container 52. The stack 72 of wafer elements of FIG. 7A and generally for any stack, will include some form of separators between each wafer element. The separators may be for example thin disks constructed of paper or foam, and/or a carbon/carbon impregnated material. Such an arrangement using all of the above is illustrated in FIG. 7B wherein a container 98 has a wafer element 100 placed therein, with a carbon interleaf 102, a foam material 104, and a paper interleaf 106 are in position for placement on top of the wafer element 100. A cover 108 is also shown.

Figure 8:
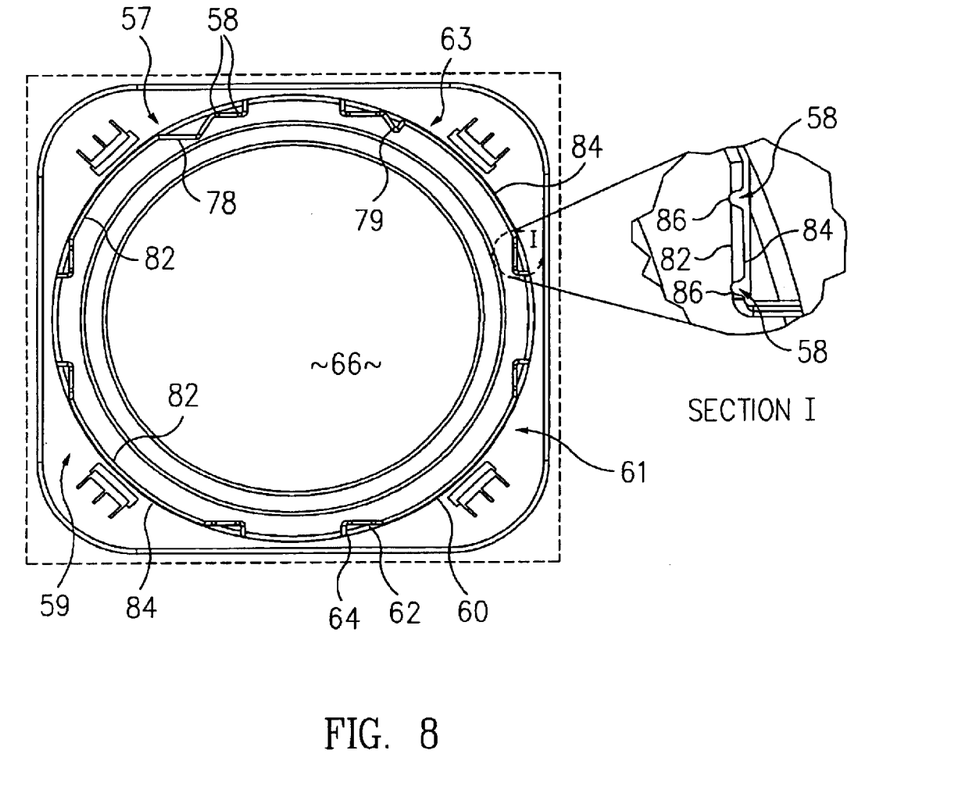
FIG. 8 is a top view of the container of FIG. 6.

FIG. 8 is a top view of the container 52 of FIGS. 6 and 7A for showing more clearly the position of the 16 columns 58 and the shape of the wall sections 57, 59, 61 and 63. In reference to the wafer frame 76 shown in FIG. 7A, wall sections 57 and 63 have contour irregularities which will be referred to as orientation artifacts 78 and 79. The frames 76 have corresponding mating irregularities which will be referred to as alignment artifacts 80 and 81. Without at least one each of the orientation artifacts and alignment artifacts, the wafer frame could be in any one of four positions. Of course, if the wall sections and wafer frames conformed to a circular pattern, the wafer frames could have any orientation without the wall and frame mating irregularities. Although FIGS. 7A and 8 show two orientation artifacts 78 and 79 in the walls with corresponding mating alignment artifacts 80 and 81 in the frames 76, the present invention applies to any number of artifacts (one or more) that function to assure the orientation of the wafer frame in the container. For example, a single asymmetrical irregularity such as 79 is sufficient to assure only one position/orientation possible for a frame.

The draft angle of the wall sections 60, 62, and 64 is evident by the line 82 indicating the inside perimeter of the wall section at the level of the bottom of the wall structure 56. Line 84 indicates the inner perimeter of the wall section at the top of the wall, which clearly lies outside the line 82 at the bottom, and therefore indicates the draft angle. This detail is more clearly shown in the enlarged section I.

Section A also shows columns 58 more clearly. Note that the top view of FIG. 8 shows only a single line 86 passing across the line of contact i.e. the line which would contact a wafer or wafer frame. The single line indicates that the line of contact is perpendicular to the base 66, and therefore the line of contact does not show in the top view of FIG. 8. In contrast, the two lines 82 and 84 indicate the draft angle of the wall sections 57, 59, 61, 63.

Figure 9:
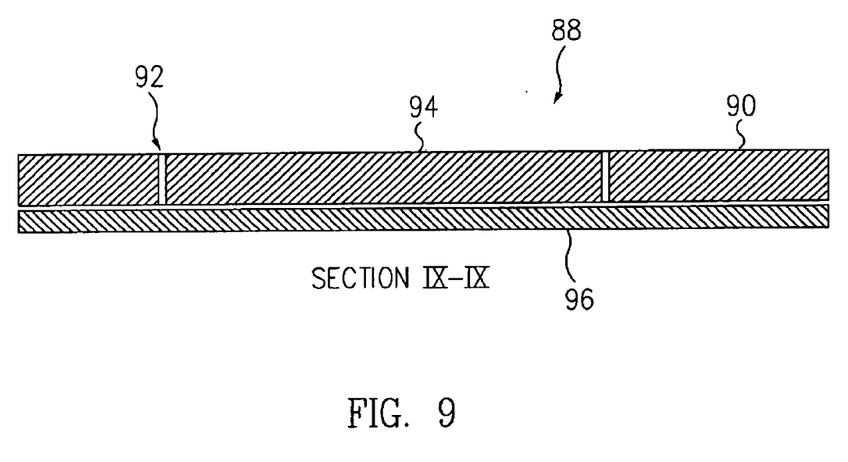
FIG. 9 is a cross sectional view from FIG. 7A showing a method of attaching a wafer to a frame.

FIG. 9 is a cross sectional view of one wafer element 88, including a wafer frame 90 in the general shape of a ring with a hole 92 there-thru into which is placed a wafer 94. FIG. 9 is presented in order to describe a method of attaching a wafer 94 to a frame 90. The attachment as shown in FIG. 9 is accomplished using an adhesive film 96, placed with an adhesive surface in contact with a bottom surface of the frame 90 and with a bottom surface of wafer 94. The use of tape 96 is well understood by those skilled in the art for the purpose of securing a wafer 94 within a frame 90. The tape 96 generally covers substantially all of the bottom surface of the frame, as well as the entire bottom surface of the wafer. The tape normally used has a characteristic (example, blue color) that it does not absorb laser energy used to cut a wafer. In some applications, the tape is applied to the frame, then a wafer is placed in the hole 92 on the adhesive of the tape. A laser is then used in this particular application to cut the wafer into separate parts, i.e., the wafer is diced. The tape remains undisturbed by the cutting of the wafer. A typical thickness of the wafer frame is 0.030 inches.

While the present invention has been described herein with reference to particular embodiments thereof, a latitude of modifications, various changes and substitutions are intended in the foregoing disclosure, and it will be appreciated that in some instances some features of the invention will be employed without a corresponding use of other features without departing from the spirit and scope of the invention as set forth in the appended claims.

What is claimed is:

1. A wafer storage container apparatus comprising:
   a wafer storage chamber for storing a stack of wafer elements, the wafer storage chamber including a base having a wafer area with a specific diameter upon which to place the stack of wafer elements;
   a wall structure extending from the base, said wall structure having a draft angle; and
   a plurality of columns disposed within the wafer storage chamber on the wall structure, each column having a surface with a line of contact to restrict lateral movement of each of the wafer elements within the wafer storage chamber, wherein each portion of the wafer area has said specific diameter throughout the height of the wafer storage chamber.

2. An apparatus as recited in claim 1 wherein each line of contact lies in a direction orthogonal to a plane of the wafer area.

3. An apparatus as recited in claim 1 wherein each column is integrally formed with the wall structure.

4. An apparatus as recited in claim 1 further comprising a cover that conforms with the wall structure to completely enclose the stack of wafer elements.

5. An apparatus as recited in claim 1 wherein each line of contact lies in a direction orthogonal to a plane of the wafer area.

6. An apparatus as recited in claim 5 wherein each column is integrally formed with the wall structure.

7. A wafer storage container apparatus for storing a stack of wafers, the apparatus comprising:
   a wafer storage chamber;
   at least one orientation artifact disposed within the wafer storage chamber;
   a plurality of wafer frames adapted for insertion into the wafer storage chamber in a stack, each wafer frame including at least one alignment artifact thereon and each wafer frame being adapted to assist holding one of the wafers in a predetermined position thereon, wherein each at least one alignment artifact corresponds to a corresponding at least one orientation artifact, thereby orienting each wafer frame in the wafer storage chamber and preventing substantial rotational movement of each wafer frame within the wafer storage chamber; and
   a plurality of columns disposed within the wafer storage chamber, each column having a surface with a line of contact to restrict lateral movement of each wafer frame within the wafer storage chamber.

8. An apparatus as recited in claim 7 wherein the wafer storage chamber includes:
   a base upon which to place the stack; and
   a wall connected to the base that is adapted the stack.

9. An apparatus as recited in claim 8 wherein the orientation artifact is a wall contour artifact disposed on the wall, and wherein the alignment artifact is a contour artifact disposed on an edge of the wafer frame.

10. An apparatus as recited in claim 8 wherein:
    each wafer frame includes a plurality of alignment artifacts and there exists a corresponding plurality of orientation artifacts disposed within the wafer storage container; and
    each orientation artifact is a wall contour artifact disposed on a different location of the wall, and wherein the alignment artifact is a contour artifact disposed on a different edge location of the wafer frame.

11. An apparatus as recited in claim 8 further comprising a cover adapted for insertion on a top of the wall.

12. An apparatus as recited in claim 7 wherein each wafer further includes an alignment artifact.

13. An apparatus as recited in claim 7 wherein each of the wafer frames includes a wafer surface on which one of the wafers rests, and the wafer surface is made of a material that assist in maintaining adhesion between the wafer frame and the wafer disposed thereon.

14. An apparatus as recited in claim 7 wherein each wafer frame includes a plurality of alignment artifacts and there exists a corresponding plurality of orientation artifacts disposed within the wafer storage container.

15. An apparatus as recited in claim 7 wherein each line of contact lies in a direction orthogonal to a plane of the wafer area.

16. An apparatus as recited in claim 15 wherein the wafer storage chamber includes a wall extending from the base, wherein the wall has a draft angle that facilitates removal of the wafer storage chamber from a mold.

17. An apparatus as recited in claim 16 wherein each column is integrally formed with the wall.

18. A wafer storage container comprising:
    a) a stack of at least two wafer elements positioned on a wafer area;
    b) a base that includes the wafer area surrounded by a wall structure having a draft angle;
    c) a plurality of columns orthogonal to the base and formed on the wall structure, wherein an equal clearance exists between each column and the stack at any point along the periphery of the stack to restrict movement of the wafer elements within the stack during storage.

19. The wafer storage container of claim 18, further comprising a cover having a continuous wall structure.

20. The wafer storage container of claim 18, wherein the wall structure of the base is discontinuous.

21. The wafer storage container of claim 18, wherein each column is integrally formed with the wall structure.

* * * * *

UNITED STATES PATENT AND TRADEMARK OFFICE
CERTIFICATE OF CORRECTION

PATENT NO. : 6,915,906 B2
DATED : July 12, 2005
INVENTOR(S) : James D. Pylant et al.

It is certified that error appears in the above-identified patent and that said Letters Patent is hereby corrected as shown below:

Column 5,
Line 8, replace "a wafer storage chamber for storing a stack of wafer elements," with -- a wafer storage chamber having a specific height for storing a stack of wafer elements --.

Column 6,
Line 2, replace "adapted the stack" with -- adapted to surround the stack --.
Line 23, replace "assist" with -- assists --.

Signed and Sealed this

Sixteenth Day of May, 2006

JON W. DUDAS
*Director of the United States Patent and Trademark Office*